(12) United States Patent
Bode

(10) Patent No.: US 7,948,803 B2
(45) Date of Patent: May 24, 2011

(54) NON-VOLATILE MEMORY DEVICE AND A PROGRAMMABLE VOLTAGE REFERENCE FOR A NON-VOLATILE MEMORY DEVICE

(75) Inventor: Hubert M. Bode, Haar (DE)

(73) Assignee: Freescale Semiconductor, Inc., Austin, TX (US)

( * ) Notice: Subject to any disclaimer, the term of this patent is extended or adjusted under 35 U.S.C. 154(b) by 219 days.

(21) Appl. No.: 12/282,547

(22) PCT Filed: Mar. 16, 2006

(86) PCT No.: PCT/EP2006/002407
§ 371 (c)(1),
(2), (4) Date: Sep. 11, 2008

(87) PCT Pub. No.: WO2007/104336
PCT Pub. Date: Sep. 20, 2007

(65) Prior Publication Data
US 2009/0097324 A1 Apr. 16, 2009

(51) Int. Cl.
G11C 16/06 (2006.01)
(52) U.S. Cl. .......... 365/185.21; 365/189.02; 365/189.09
(58) Field of Classification Search ............. 365/185.21, 365/189.02, 189.09
See application file for complete search history.

(56) References Cited

U.S. PATENT DOCUMENTS

| | | | |
|---|---|---|---|
| 5,513,147 A | 4/1996 | Prickett, Jr. | |
| 5,693,570 A | 12/1997 | Cernea et al. | |
| 5,784,327 A * | 7/1998 | Hazani | 365/189.03 |
| 5,963,477 A | 10/1999 | Hung | |
| 6,466,478 B1 | 10/2002 | Park | |
| 6,618,297 B1 * | 9/2003 | Manea | 365/189.09 |
| 6,791,873 B1 | 9/2004 | Perner | |
| 6,865,110 B1 | 3/2005 | Park | |
| 6,914,818 B2 | 7/2005 | Yamazaki et al. | |
| 7,457,178 B2 | 11/2008 | Tu et al. | |

(Continued)

FOREIGN PATENT DOCUMENTS

| | | |
|---|---|---|
| DE | 10062123 C1 | 6/2002 |
| EP | 0734024 A1 | 9/1996 |
| EP | 0880143 A2 | 11/1998 |
| WO | 0124191 A | 4/2001 |

OTHER PUBLICATIONS

Final Office Action mailed Aug. 26, 2010 for U.S. Appl. No. 12/282,548, 7 pages.
Non-Final Office Action mailed Apr. 27, 2010 for U.S. Appl. No. 12/282,548, 15 pages.
Notice of Allowance mailed Nov. 4, 2010 for U.S. Appl. No. 12/282,548, 6 pages.
Non-Final Office Action mailed Nov. 29, 2010 for U.S. Appl. No. 12/282,543, 13 pages.

*Primary Examiner* — Tuan T. Nguyen

(57) ABSTRACT

A non-volatile memory device includes a voltage reference generator comprising a programmable voltage reference for generating a voltage signal having a programmable voltage level. In an embodiment, the programmable voltage reference provides the voltage signals for a wordline driver and/or a bitline current generator of the non-volatile memory device. The programmable voltage reference may comprise a Digital-to-Analog converter coupled between first and second supply voltages. A programmable current reference is also disclosed.

20 Claims, 10 Drawing Sheets

U.S. PATENT DOCUMENTS

| | | | |
|---|---|---|---|
| 7,724,600 B1 * | 5/2010 | Im et al. | 365/225.7 |
| 2001/0005015 A1 | 6/2001 | Futatsyama | |
| 2003/0179608 A1 | 9/2003 | Iorio | |
| 2004/0046681 A1 | 3/2004 | Frulio et al. | |
| 2005/0219914 A1 | 10/2005 | Sarin et al. | |
| 2007/0041244 A1 | 2/2007 | Chih et al. | |
| 2008/0123427 A1 * | 5/2008 | Hsu | 365/185.21 |
| 2009/0027972 A1 | 1/2009 | Bode | |
| 2009/0097323 A1 | 4/2009 | Bode | |
| 2010/0246267 A1 * | 9/2010 | Hasler et al. | 365/185.15 |

* cited by examiner

NON-VOLATILE MEMORY DEVICE AND A PROGRAMMABLE VOLTAGE REFERENCE FOR A NON-VOLATILE MEMORY DEVICE

FIELD OF THE INVENTION

The present invention relates to a non-volatile memory device having a programmable voltage reference and a programmable voltage reference for the same.

BACKGROUND OF THE INVENTION

Non-volatile memory (NVM) is the general term used to describe the type of memory that retains its data even when power is turned off, and this sort of memory is typically used to store data that must not be lost when a device incorporating the memory looses power. Such devices include computers, CD-ROMs, mobile phones, digital cameras, compact flash cards, mp3 players and Micro-Controller Units (MCUs) from the automotive, aero and other industries.

Types of non-volatile memory include Read Only Memory (ROM), Electrically Programmable Read Only Memory (EPROM), Electrically Erasable and Programmable Read Only Memory (EEPROM), Flash EEPROMs, Non-Volatile Static Random Access Memory (NVSRAM), Ferroelectric Random Access Memory (FeRAM), and the like.

Whilst some non-volatile memory is purely "read only", with the "programming" being done by hard-coding the data during the memory fabrication process, other types are programmed electrically post-fabrication.

One type of programmable non-volatile memory the present invention relates to is Electrically Erasable and Programmable Read Only Memory (EEPROM), however the invention may equally be applied to other non-volatile memory types listed above. Electrically Erasable and Programmable Read Only Memory (EEPROM) can be split into two sub types: byte erasable and Flash EEPROM. As the name suggests, the byte erasable type can be erased and written in byte size chunks, whilst flash memory is written in byte (or larger) sized chunks, but is erased in sections (which are multiple bytes in size). The size of the sections erased in flash memory is part specific, and can be anywhere in size from meaning the entire memory array of the device to only a sub-portion, or sector, comprising a small number of individual bytes.

EEPROMs store information by storing charge on an insulated piece of semiconductor material, known as the floating gate. Typically, the insulating material is a layer of Silicon Dioxide. As is known in the art, this charge is moved onto the insulated material forming the memory cell by either Hot Carrier Injection (HCI) or Fowler-Nordheim Tunnelling (FNT). Each individual memory cell can store a single bit of information, thus they are often referred to as bitcells.

Briefly, Hot Carrier Injection (via either Hot holes, i.e. positive charges, or Hot electrons, i.e. negative charges) works by applying a large voltage bias across the channel of the bitcell, resulting in the "heating", i.e. energy injection, of the carriers within the channel, which provides some of them with enough energy to surmount the silicon dioxide energy barrier, and thus are "injected" into the insulated material.

Meanwhile, Fowler-Nordheim tunnelling works by applying a high electric field between the gate of the bitcell and either the source or drain. Assuming the field is high enough, this high electric field lowers the height of the energy barrier of the silicon dioxide layer and thus allows electrons to "tunnel" across the insulated material and onto the floating gate forming the bitcell.

When there is little or no charge on the floating gate, the threshold voltage Vt of the transistor forming the bitcell is low. As charge is moved onto the floating gate during programming by the above methods, the threshold voltage Vt of the bitcell increases. Once the amount of charge stored on the floating gate reaches a predetermined level, the bitcell is considered programmed.

The predetermined level of charge that signifies a programmed state is arbitrary, but must be high enough to be easily distinguished from the unprogrammed state.

The movement of this charge onto or off the floating gate is known as "programming" (of the bitcell). However, "programming" does not in itself refer to a particular data state of the bitcell (1 or 0), because due to possible logical inversion at the output from the core memory array and/or the output to the data bus, the programmed state may correspond to either a logic 1 or 0. For this reason, in the following description it will be assumed that "programmed" means that charge has been stored on the floating gate, resulting in a high threshold voltage Vt, whilst "unprogrammed" means that little or no charge is stored in the floating gate, thus a low Vt.

Memory bitcells are read by applying the correct bias voltages to the bitcell and measuring the resultant current flow using current senseamps. The read voltages are set such that if the threshold voltage Vt is high, due to the bitcell being programmed, then little or no current flows, so little or nothing is detected by the senseamp. Conversely, if the threshold voltage Vt is low, due the to the bitcell being unprogrammed, significantly more current flows that is detected by the senseamp. Multiple cells may be read at one time, by using multiple senseamps.

Since, in a typical memory array, there are multiple bitcells connected to the same bitlines, wordlines and sourcelines, problems can occur if the applied voltages and currents are not perfectly matched to the requirements of the bitcell being programmed. In other words, applying incorrect voltages and currents to the array can result in unintentional erasure or programming of the other bitcells not currently being programmed. These arise during programming and erasing, and are commonly referred to as disturbs.

In the case of flash memory, the array gets erased on an erase sector granularity (an erase sector being a predefined number of bitcells). However, bitcells may be programmed on a bit by bit basis. Therefore, there are two types of unintended disturbs that may occur on erased bitcells, during the intended programming of another bitcell in the same high voltage sector:

1. Row disturb—occurs on bitcells sharing the same wordline but on a different bitline to the intended target bitcell. The Vgs (i.e. the voltage across the gate and source of the transistor forming the bitcell) of those bitcells is characterised as (Vpwl—(unselected bitline voltage)), where Vpwl is the voltage applied to the selected wordline during programming. In order to avoid row disturb, the Vgs should be negative enough to avoid generation of hot electrons in the channel of the unselected bitcell. This is called maintaining a row disturb margin.

2. Bitline disturb—occurs on bitcells sharing the same bitline but on a different wordline to the intended target bitcell (but in the same high voltage sector). This disturb mechanism is only applicable if the high voltage sector is bigger than a single wordline. The Vgs of those cells is (0V—(selected bitline voltage)). Similarly, in order to avoid bitline disturb, this Vgs must be negative enough to avoid the generation of hot electrons in the channel. It also has to be ensured that selected bitlines will never reach potentials too low to create such a disturb, but they need to be driven low enough to allow proper programming of the bitcells intended to be programmed.

As is known in the art, the above described physical methods used to program the bitcells are carried out by biasing the terminals of the bitcell to be programmed (or read, or erased) with the correct voltages. These bias voltages are derived from reference voltages.

Prior art systems for producing the necessary reference voltages make use of certain physical device parameters to derive the required voltages. This is to say, they create the required voltages by using multiple semiconductor devices with certain physical dimensions that result in predetermined voltage drops across each of them, for example transistors, zener diodes and the like. These devices are then stacked up to produce the required voltage drop.

The problem with such prior art systems is that they rely on the relative physical dimensions as well as diffusion levels of the devices used to determine the levels of the bias voltages, which are subject to manufacturing tolerances. Thus, when a design of such prior art arrangements is transferred to silicon and the resulting device tested, in view of the manufacturing tolerances changes in the design may be required in order to achieve the required bias voltage levels. This requires changes in masks and may require several mask change iterations and is thus time consuming and costly. Moreover, since these parameters are fixed during manufacture, they cannot be subsequently changed, for example, to compensate for operating temperate range changes. The only way to change these parameters is to redesign the physical parameters of the devices used, and then manufacture a whole new device with the new parameters. This is a costly and time consuming process. Further, since manufacturing tolerances are involved in setting the device characteristics, redesigns might not even solve any issue with the final product. In this case, a solution may be to selectively pick the devices that exhibit the required characteristics, with the remainder being wasted (and/or used in applications with lower specification requirements). This obviously affects production yield of such non-volatile memory devices considerably.

In addition, in order to provide bias voltages having the required levels to achieve the required disturb margins, the prior art zener stack arrangements require certain zener elements (such as transistor FETodes) which evices can have undesirable electrical behaviour.

Accordingly, it would be desirable to provide an improved voltage generator for a non-volatile memory array which overcomes or at least alleviates some or all of the above referenced problems.

SUMMARY OF INVENTION

The present invention provides a non-volatile memory device, a programmable voltage reference and a programmable current reference as claimed in the accompanying claims.

BRIEF DESCRIPTION OF THE DRAWINGS

A non-volatile memory device and a programmable voltage reference in accordance with the invention will now be described, by way of example only, with reference to the accompanying drawings in which.

SPECIFIC DESCRIPTION

Figure 1:
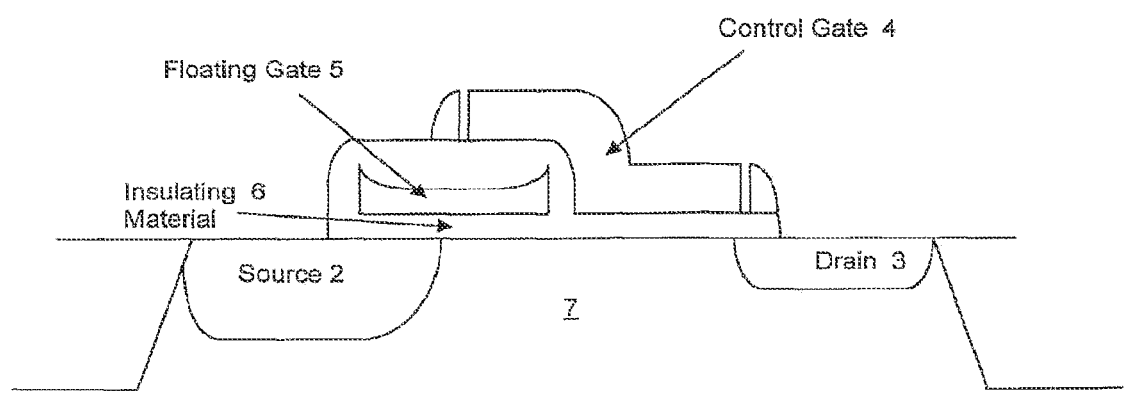
FIG. 1. shows a side view schematic of a typical 1.5 transistor split gate memory bitcell, exemplary of the type suitable for use with the present invention.

FIG. 1 shows a side view schematic detailing the construction of an example 1.5-transistor split gate non-volatile memory bitcell 10, which is typical of the type of bitcell 10 used in such non-volatile memory devices. However, the present invention equally applies to other forms of bitcells, for example 1-transistor bitcells and 2-transistor bitcells. The actual type of bitcell used only effects the exact bias conditions required.

The non-volatile memory bitcell 10 comprises a source 2, a drain 3, a control gate 4, a floating gate 5, insulating material 6, all formed on a silicon substrate 7. The bitcell 10 is constructed using the typical techniques known in the art for constructing semiconductors, including lithographic techniques, ion implantation and the like. The insulating material 6 is, for example, silicon dioxide.

Figure 2:
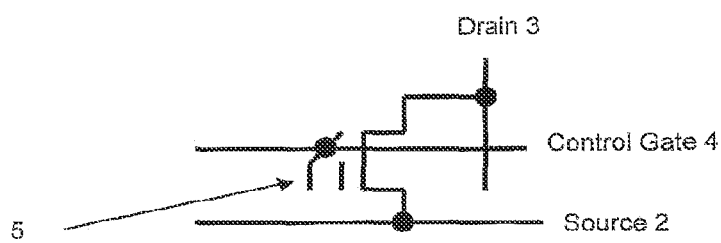
FIG. 2. is an electrical schematic of the 1.5 transistor memory bitcell of FIG. 1.

FIG. 2 is a typical electrical schematic symbol for the 1.5-transistor bitcell 10 of FIG. 1, which will be used in the subsequent figures.

Figure 3:
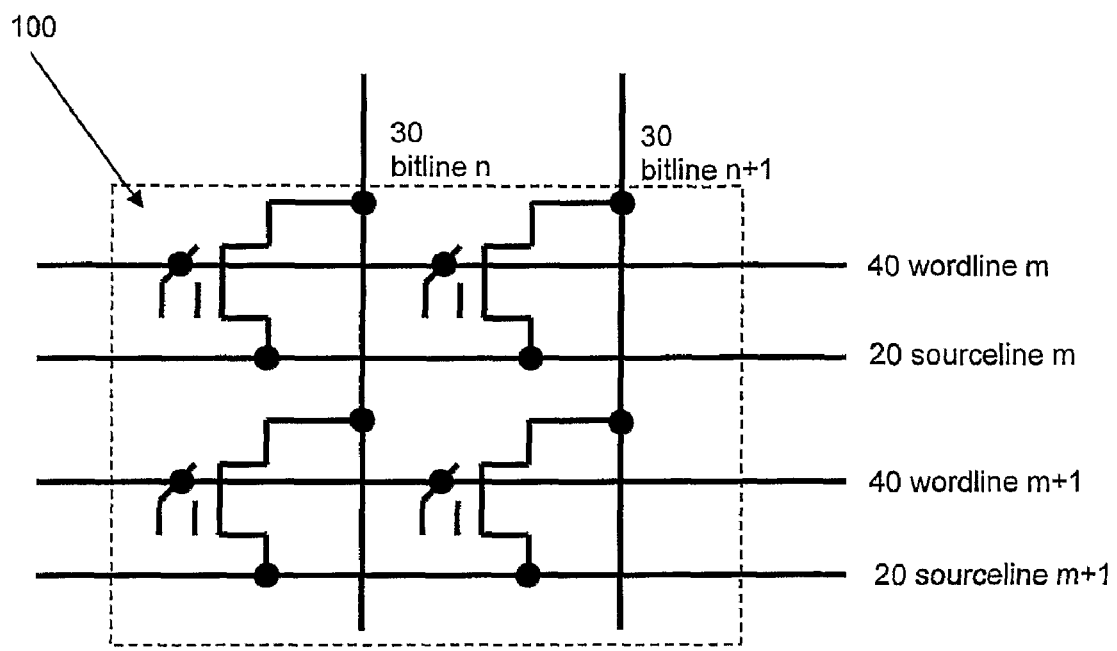
FIG. 3 is a schematic diagram of four bitcells of FIG. 1 arranged in the typical memory array configuration, suitable for use with the present invention.

Non-volatile memory (NVM) is typically constructed in the form of an N by M array 100, with N columns and M rows of bitcells 10, as shown in FIG. 3.

As can be seen from this figure, bitcells 10 in the same column have their respective drains 3 connected to a common bitline 30. Meanwhile, bitcells 10 in the same row have their sources 2 connected to a common sourceline 20 and their control gates 4 connected to a common wordline 40.

In this way, each column is addressed by a single bitline 30, and each row is addressed by both a wordline 40 and sourceline 20. Accordingly bitcells 10 are read, erased or programmed by applying the correct voltage levels to the respective bitline 30, wordline 40 and sourceline 20 of the desired bitcell(s) 10.

In standby mode, all bitlines 30, wordlines 40 and sourcelines 20 are held at their standby voltages, for example 0V.

In the following description of Erase, Program and Read operations for an non-volatile memory array 100, an exemplary portion of an non-volatile memory array 100 is shown. Since (for a flash device) an erase operation cannot be divided in to portions smaller than a wordline, both bitcells 10 in the top row are selected, and therefore are erased. For Program and Read operations, however, the selected bitcell 10 (i.e. the bitcell 10 to which the operation in question is being applied) is the top left bitcell 10. The remaining bitcells are all unselected. Also where, in the example given, only one bitcell 10 is being operated on, it will be apparent to the person skilled in the art that multiple locations, i.e. a byte or more, can be operated on at the same time, according to the abilities of the circuits used to address the bitcells 10 in the memory array 100.

Erase Operation

Figure 4:
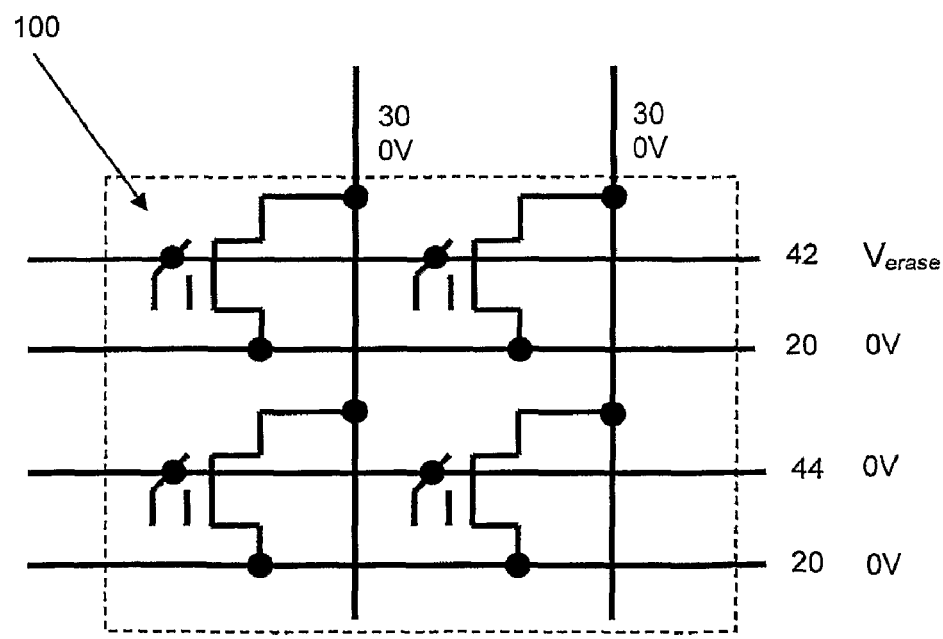
FIG. 4 is a schematic diagram of an example of the voltage bias conditions applied to the array of FIG. 3 during erase of the top row of bitcells.

FIG. 4 shows a portion of an non-volatile memory array 100 with the correct voltage levels applied for erasing the top row of bitcells 10. However, in Flash EEPROM memory in particular, these erasure voltages will be applied to multiple groups of bitcells 10 forming an erase sector, or equally the whole array in some cases.

During erase, all bitlines 30 and sourcelines 20 are grounded, i.e. held at 0V. Unselected wordlines 44 are also grounded. Meanwhile, all selected wordlines 42 are driven to the high voltage required for erasure, in this example, the erasure voltage, $V_{erase}$, is approximately 13.5V.

When the above bias conditions are set, Fowler-Nordheim Tunnelling between the control gate 4 and the floating gate 5 will reduce the number of electrons on the floating gate 5, thus increasing the potential on the floating gate 5. After erase operation, the channel below the floating gate 5 will be left in conducting state.

In the case of the exemplary split gate 1.5 transistor memory cell shown in the examples, there are in fact two portions of the channel. The first portion is below the floating gate 5, whilst the second portion is the adjacent one below the control gate 4. Together they both form the complete channel.

While the one portion below the control gate 4 can be made conducting or non conducting by the potential applied to the control gate 4 (and therefore we use this portion of the channel to "point" to the desired bitcells to be read or programmed), the portion of channel below the floating gate 5 is conducting or non-conducting due to the amount of charge left on the floating gate 5. This is the memory part of the bitcell. The structure is equivalent to two transistors connected in series. The control gate 4 extends over the floating gate 5 in order for it to be able to erase the floating gate 5 with a high potential on the control gate 4.

Program Operation

Figure 5:
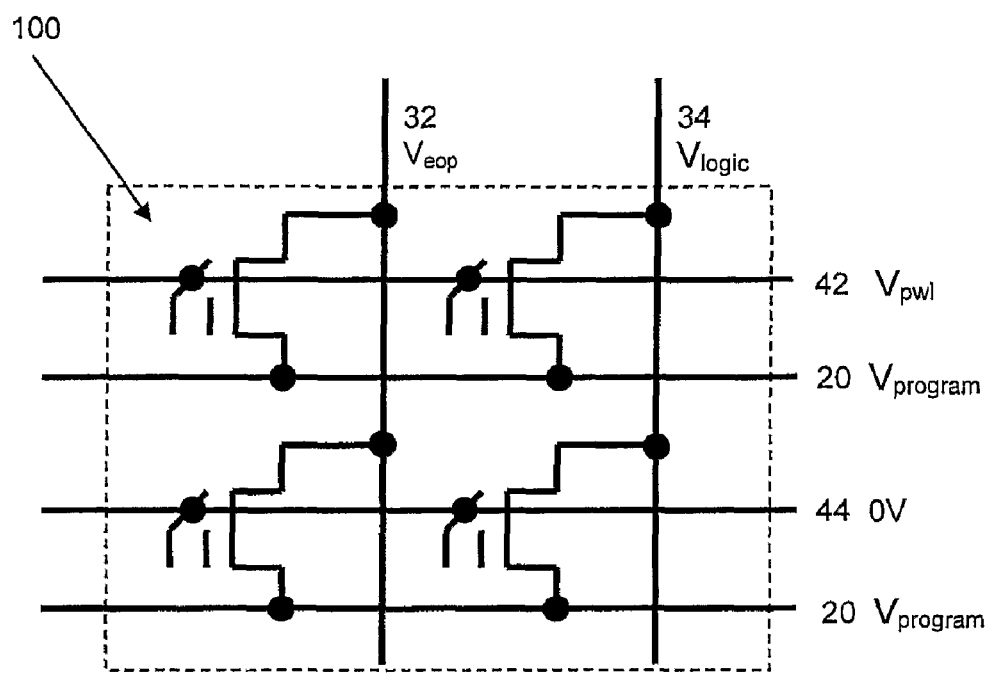
FIG. 5 is a schematic diagram of an example of the voltage bias conditions applied to the array of FIG. 3 during programming of the top left bitcell in the array.

FIG. 5 shows the same portion of non-volatile memory array 100, but with the correct voltage bias levels applied for programming the top left bitcell 10 instead.

During program, all sourcelines 20 are driven to the high voltage required for programming, $V_{program}$, which in this example is 10V. In this way, the sourcelines 30 act as the bitcell transistor's drain. Unselected wordlines 44 are driven to ground (0V) and unselected bitlines 34 are driven to logic supply, $V_{logic}$ which in this example is 2.7V.

Meanwhile, the selected wordlines 42 are driven to the wordline programming voltage, $V_{pwl}$, which in this example is set to 2.1V, and the selected bitlines 32 are pulled towards an end of programming voltage, $V_{eop}$, which in this example is set to 0.7V.

By setting the above bias conditions, current is driven through the bitcell 10, thus generating hot carriers which can then be moved onto the floating gate 5, to thereby program the bitcell 10. This will leave the portion of channel above the floating gate 5 in a non-conducting state.

Read Operation

Figure 6:
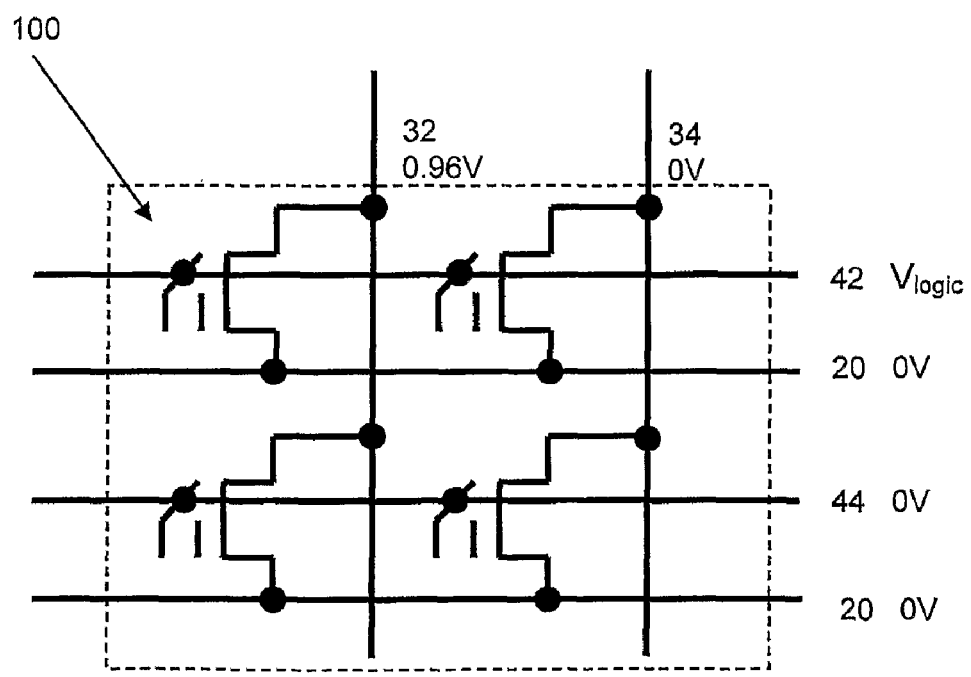
FIG. 6 is a schematic diagram of an example of the voltage bias conditions applied to the array of FIG. 3 during read of the top left bitcell in the array.

FIG. 6 shows the bias conditions applied to the same non-volatile memory array 100 during a read operation on the top left bitcell 10.

During the read operation, all sourcelines 20 are grounded (i.e. held at 0V), and any unselected wordlines 44 and bitlines 34 are also grounded. Meanwhile, the selected wordline 42 is driven to $V_{logic}$, and the selected bitline 32 is driven to its read voltage, which in the example given is 0.96V.

The amount of charge stored on the floating gate 5 of a bitcell 10 effects the turn on voltage of the transistor forming the bitcell 10. Accordingly, bitcells are "read" by detecting how much current flows in the bitcell 10 when a set voltage is applied to the bitcell. The current is detected using senseamps (not shown in the figures). This current will be discriminated against a threshold to decide whether the bitcell 10 is in a programmed (non-conducting) or erased (conducting) state. The bias conditions applied during program operation are carefully chosen and maintained such that only the potential of the floating gate 5 on the bitcells 10 which are meant to programmed are actually changed. Any potential erasure of bitcells 10 sitting on the same wordline 40, or sitting on the same bitline 30 within the same memory sector (where the programming high voltage is applied) will limit the performance or endurance of the total memory.

Figure 7:
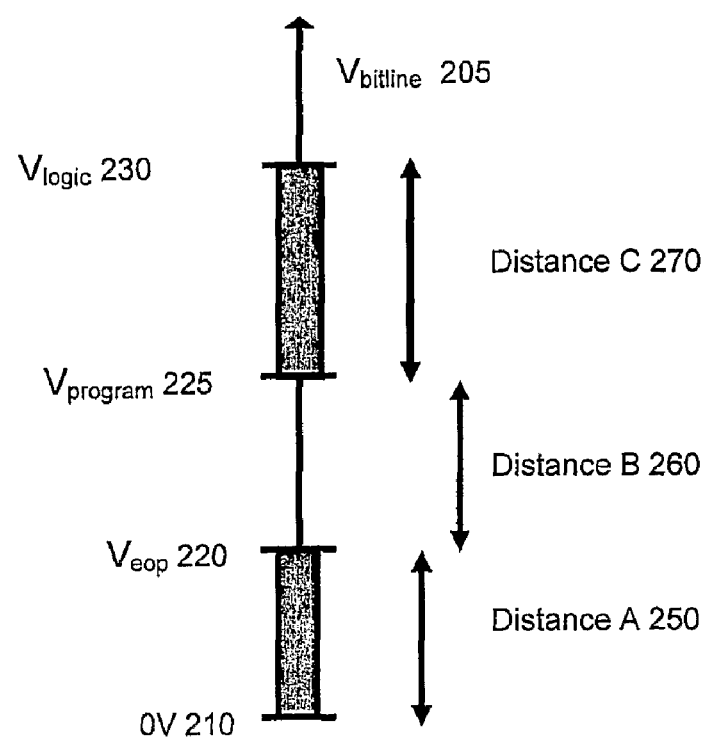
FIG. 7 is a schematic diagram of the relationship between the different bias voltages and disturb margins that are maintained to prevent disturbs on an unselected bitcell.

FIG. 7 shows the relationship between the bitline voltage 205 and the other voltages in the system including Vprogram 230, Veop 220, Logic supply 240 and Ground 210.

To ensure the above described memory disturbs do not occur during programming, respective margins must be maintained between Veop 220 and ground 210 (distance A 250), and Vprogram 230 (also known as Vpwl (program wordline voltage)) and logic supply 240 (distance C 270). This is to say that Veop must not go below a predetermined voltage above ground (i.e. 0V), and Vprogram must not go above a predetermined voltage below logic supply 240. The actual predetermined voltage limits above are bitcell specific.

Distance A 250 ensures the correct disturb margin is maintained to avoid bitline disturbs occurring for bitcells on the same bitline as the bitcell being programmed (i.e. the selected bitline 32), but on a different wordline to the bitcell being programmed (i.e. an unselected wordline 44).

Distance C 270 ensures the row disturb margin is maintained for bitcells on a different bitline to the bitcell being programmed (i.e. unselected bitline 34), but on the same wordline as the bitcell being programmed (i.e. selected wordline 42).

Distance B 260 is the region in which programming occurs, and is the case for the bitcell or bitcells being programmed, i.e. for the selected bitline 32 and wordline 42.

Figure 8:
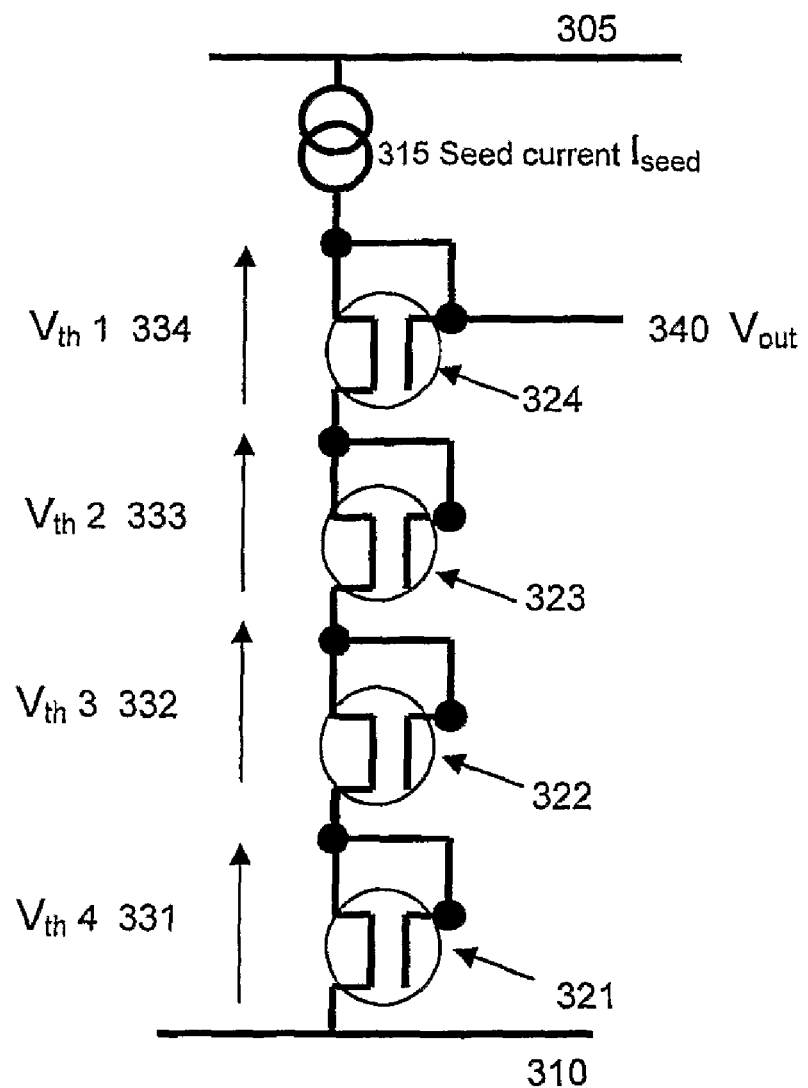
FIG. 8 is a schematic diagram of a prior art arrangement for generating a voltage reference in a non-volatile memory device.

FIG. 8 shows an exemplary prior art arrangement for producing a suitable output reference voltage 340 for a program, read or erase operation.

The circuit in FIG. 8 operates by connecting up a stack of transistors (321 to 324) with their drains connected to their gates. This means a voltage drop equal to the threshold voltage of the transistor (331 to 334) is seen across each transistor when a current is pushed through them by a current source 315. By stacking up transistors (321 to 324) configured in this way, the required voltage output 340 is achieved. Alternatively, other components, such as Zener diodes and the like may also be used to realise the required voltage references through using the necessary physical sizes of component and particular connection schemes.

Such prior art systems are physically designed to maintain the above described margins within the normal, expected, operating range of the memory device used. In this way, the margins are "hard wired" into the device during its design and fabrication. This means that in order to make any necessary changes to the margins, for example, to compensate for changes in the device operating conditions, the prior art arrangement is required to be redesigned and remade.

The present invention will now be described with reference to embodiments shown and described in FIGS. 9-14. The present invention provides a programmable voltage reference for generating at an output a voltage signal having a predetermined voltage level for one of several different operations in a non-voltage memory, such as the voltage level required for the bias voltage for a read, program or erase operation. In an embodiment of the invention, the programmable voltage reference provides more than one voltage signal, each voltage signal having the predetermined voltage level of one of the different operations in the non-volatile memory device.

Since the voltage signal(s) is generated by a programmable voltage reference, the present invention provides more precise control of the bias voltages (or set points) used during operation of the non-voltage memory device. Furthermore, since the bias voltages are generated by a programmable voltage reference, the levels of the bias voltages are not dependent on the physical dimensions of the devices used to construct the non-volatile memory. Moreover, since the bias voltages are generated by a programmable voltage reference, the levels of the bias voltages may be trimmed to account for manufacturing tolerances and/or changes in device operating conditions, for example to account for changes in temperature, without the need for device redesign and hence without the need for new masks.

Figure 9:
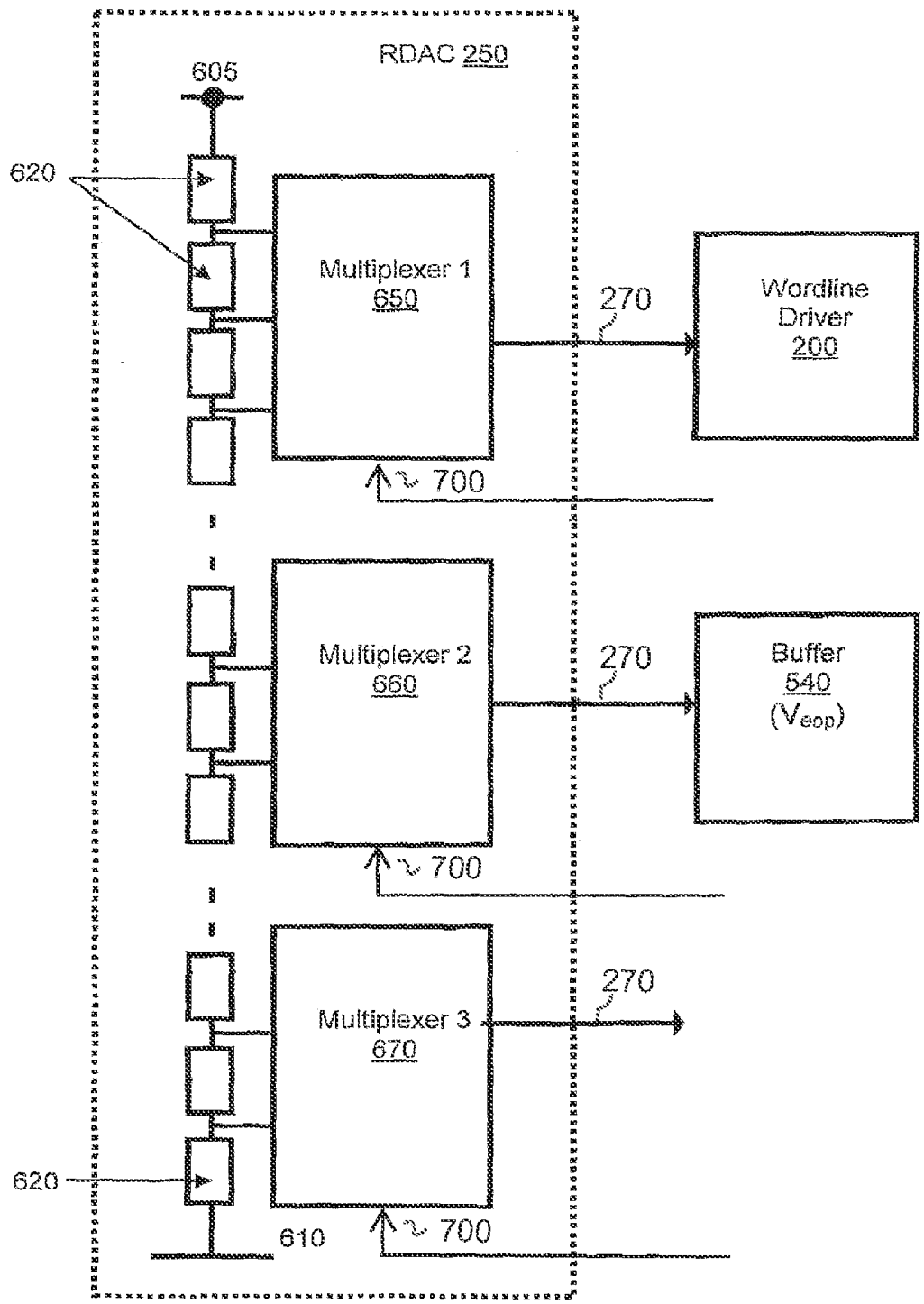
FIG. 9 is a schematic diagram of a programmable voltage reference in accordance with an embodiment of the present invention.
Figure 10:
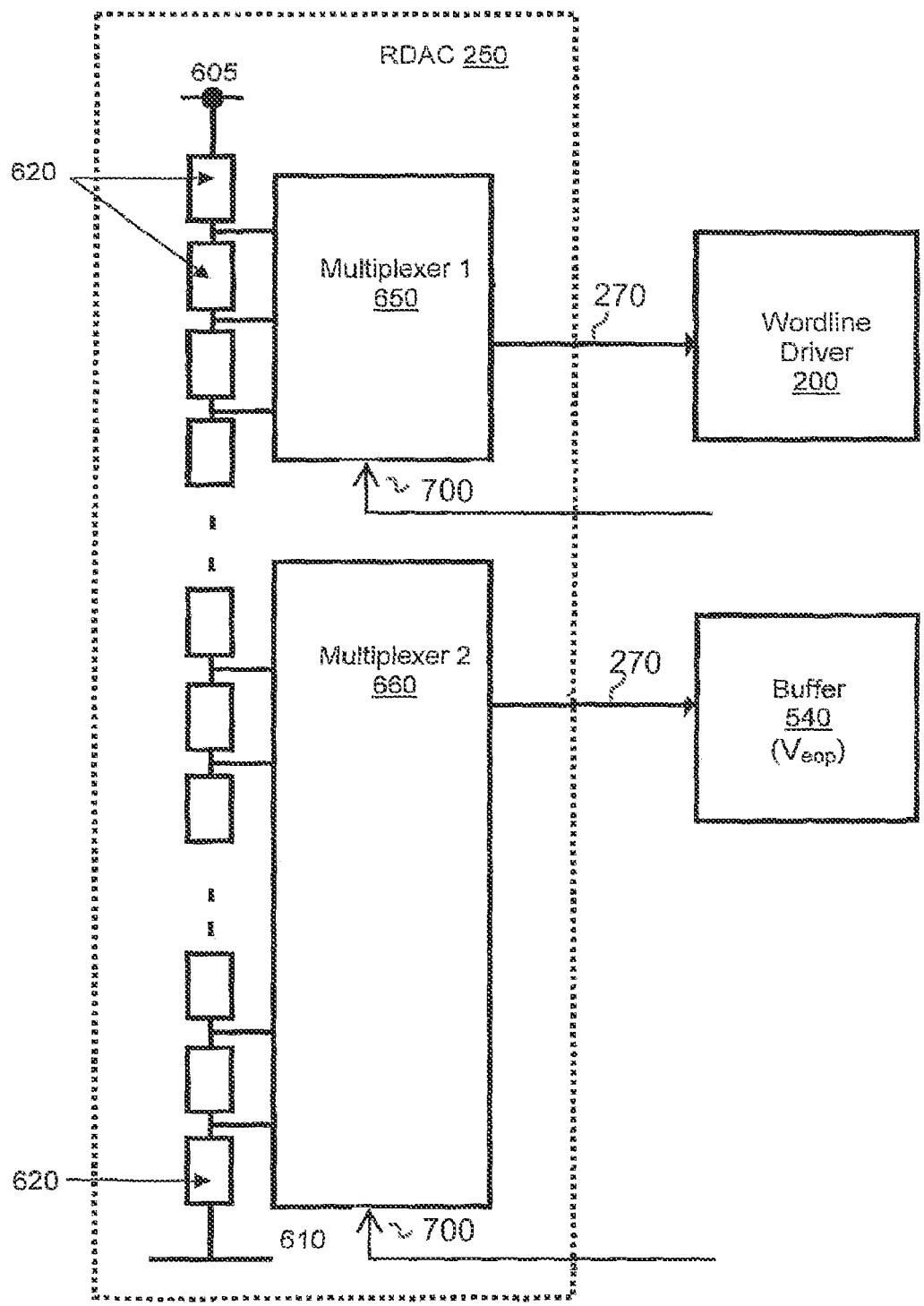
FIG. 10 is a schematic diagram of a programmable voltage reference in accordance with another embodiment of the present invention.

In an embodiment of the present invention, the programmable voltage reference comprises a Digital to Analog Converter (DAC) 250. FIG. 9 shows one embodiment of the programmable voltage reference comprising a Resistor network DAC (RDAC) 250.

In this embodiment, the RDAC 250 is constructed out of a number of resistors 620 connected in series between a first supply voltage 605 and a second supply voltage 610 (e.g. ground), with a number of digitally controlled multiplexers 650, 660, 670) each feeding off a set of taps between the resistors 620. In this way, a particular tap off the resistor network, corresponding to a particular or predetermined voltage level, can be freely selected by the multiplexers 650, 660, 670, such that a voltage signal having the predetermined voltage level is provided at an output 702. In the example shown in FIG. 9, voltage signals having three different predetermined levels are provided at outputs 702 of the multiplexers 650, 660, 670.

It should be noted that the particular voltage levels capable of being realised by an RDAC are directly related to first supply voltage 605, as well as the number and relative size of the resistors used in the network. Also, the number of multiplexers required is related to the number of different reference voltages required, and is therefore application specific.

The exact number of resistors 620 and their sizes relative to each other determine the number of, and spacing between, the different voltage levels achievable out of the RDAC 250. Further, the bit depth of the multiplexer also constrains the outputs available from the RDAC 250. Thus, the construction of the RDAC 250 is chosen according to the requirements of the non-volatile memory device, in particular how many, and how fine a grain of accuracy of, voltage reference outputs are required.

Control signals applied to control inputs 700 of multiplexers 650, 660, 670 control the selection of the tap off of the resistor network and so determine the levels of the voltage signals at the outputs of the multiplexers 650, 660 and 670. The control signals may be generated by a main processing unit (not shown) of the device of which the non-voltage memory is part (e.g. the main CPU of an embedded microcontroller) or may be generated by a processing unit (not shown) dedicated for controlling the non-volatile memory.

In a preferred embodiment, the RDAC 250 is constructed out of 27 unit sized resistors 620 numbered 1 to 27 from the bottom up. The first multiplexer 650 (at the top of FIG. 10) has taps after 17, 18, 19, 20, 21, 22, 23 and 24 unit resistors respectively, and the second multiplexer 660 (at the bottom of FIG. 10) has taps after 2, 4, 6, 7, 8, 10 and 12 unit resistors respectively. Both multiplexers (650, 660) are 3 bit multiplexers to select between the above identified seven taps for each multiplexer. Of course, the bit depth of the multiplexers used depends on the number of different voltage levels required at the output.

In an embodiment of the present invention, the optimum levels for the different bias voltages required for a non-volatile memory may be determined during the design and manufacturing process of the device (e.g. through simulation, and/or pre-production testing). These optimum levels may then be stored in registers or memory (not shown), for example memory associated with the processing unit (main or dedicated) which controls the non-volatile memory, and then used subsequently to trim the levels of the voltage signals provided at the output of the programmable voltage reference 250. This trimming may be under the control of a software program running on the main or dedicated processing unit. For example, a subroutine may provide, on start-up of the memory device, for the optimum voltage bias levels to be read out of memory and applied to the programmable voltage reference 250 by the processing unit providing the appropriate controls signals to the multiplexers 650, 660, 670 of FIGS. 9 and 10. Furthermore, a look-up table may be generated and stored in memory which provides the optimum levels of the different bias voltages for different operating conditions of the non-volatile memory, for example different voltage levels for different operating temperatures. As the operating conditions change, the look-up table can be used by the processing unit to vary the levels of the bias voltages to ensure optimum operation of the non-volatile memory (during operation). This is not possible in the prior art arrangements which use fixed voltage references.

Figure 11:
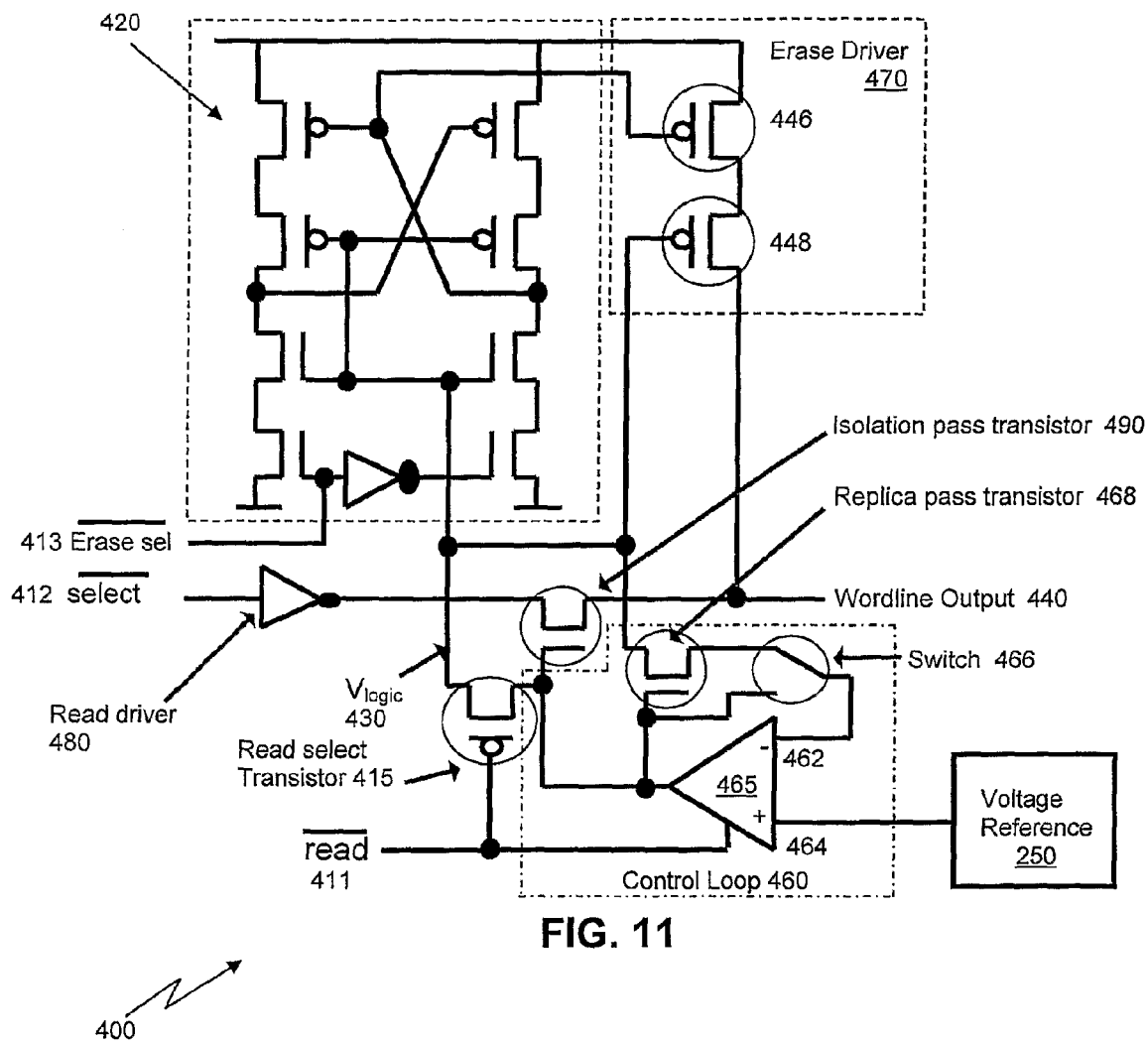
FIG. 11 is a schematic diagram of a wordline driver of a non-volatile memory device incorporating the programmable voltage reference according to the present invention.

FIG. 11 shows an exemplary use of a programmable voltage reference according to the present invention. In this example, the programmable voltage reference 250 is being used in a wordline driver 400 of a non-volatile memory device to set the output voltage of the wordline driver via a control loop 460.

The embodiment of the wordline driver 400 shown comprises three active-low inputs: read 411, select 412 and erase select 413. These inputs set the required state, and therefore the voltage at the output 440, of the wordline driver 400.

The wordline driver further includes a read select/bypass PMOS transistor 415, a level shifter 420, a logic level voltage supply ($V_{logic}$) 430, an output 440, a programmable voltage reference 250, a control loop 460, a first power source, such as an erase driver 470, a second power source, such as a read driver 480, and an isolation transistor 490.

The transistors used in the wordline driver 400 may be either PMOS or NMOS devices. As is known in the art, such devices have a control electrode, i.e. gate, and first and second current electrodes, i.e. their source and drain.

The read select/bypass PMOS transistor 415, when turned on by applying a low voltage (i.e. equivalent to a "0" in logic terms), connects the gate of the isolation transistor 490 to logic supply, $V_{logic}$. This is done to strongly turn on the isolation transistor 490, to thereby fully connect the read driver 480 to the wordline output 440 during a Read operation.

The cascoded level shifter 420 supplies the erase level voltage to the erase driver 470 during erase operation, and a normal, logic level, voltage at other times. The level shifter is constructed as is commonly known in the art, and as shown in the figures.

The control loop 460 comprises a second, replica, isolation transistor 468, an operational amplifier 465 in a feedback configuration, and a switch 466 for switching the replica transistor 468 in and out of the operational amplifier's 465 feedback loop. The programmable voltage reference 250 provides its output voltage to the non-inverting input 464 of the operational amplifier 465. The operational amplifier 465 is disabled by applying an active low signal on the read input 411.

The erase driver 470 is formed from two cascoded PMOS transistors 446 and 448, connected between the erase voltage supply coming out of the level shifter 420, and the wordline output 440.

In the wordline driver of FIG. 11, when the control loop is enabled by holding the active low read input 411 high, the programmable voltage reference 250 is set, for example via control signals applied to the multiplexers 650, 660, 670, to output either logic supply −0.5V (which is 2.2V in this example) or to the required wordline voltage during programming operation, Vpwl, dependent on whether the circuit is in erase or program mode respectively.

When the active low read input 411 is held low, the control loop 460 is disabled; therefore the output of the programmable voltage reference 250 is not directly used in the wordline driver 400 anymore.

It will be appreciated that since the programmable voltage reference 250 is coupled to the first supply voltage 605, the programmable voltage reference 250 can ensure that the level of the programming voltage Vpwl does not reach the first supply voltage and hence the wordline disturb margin is ensured (see FIG. 7 and the accompanying description). For example, the output of the RDAC 250 is not tapped at the first supply voltage 605.

Figure 12:
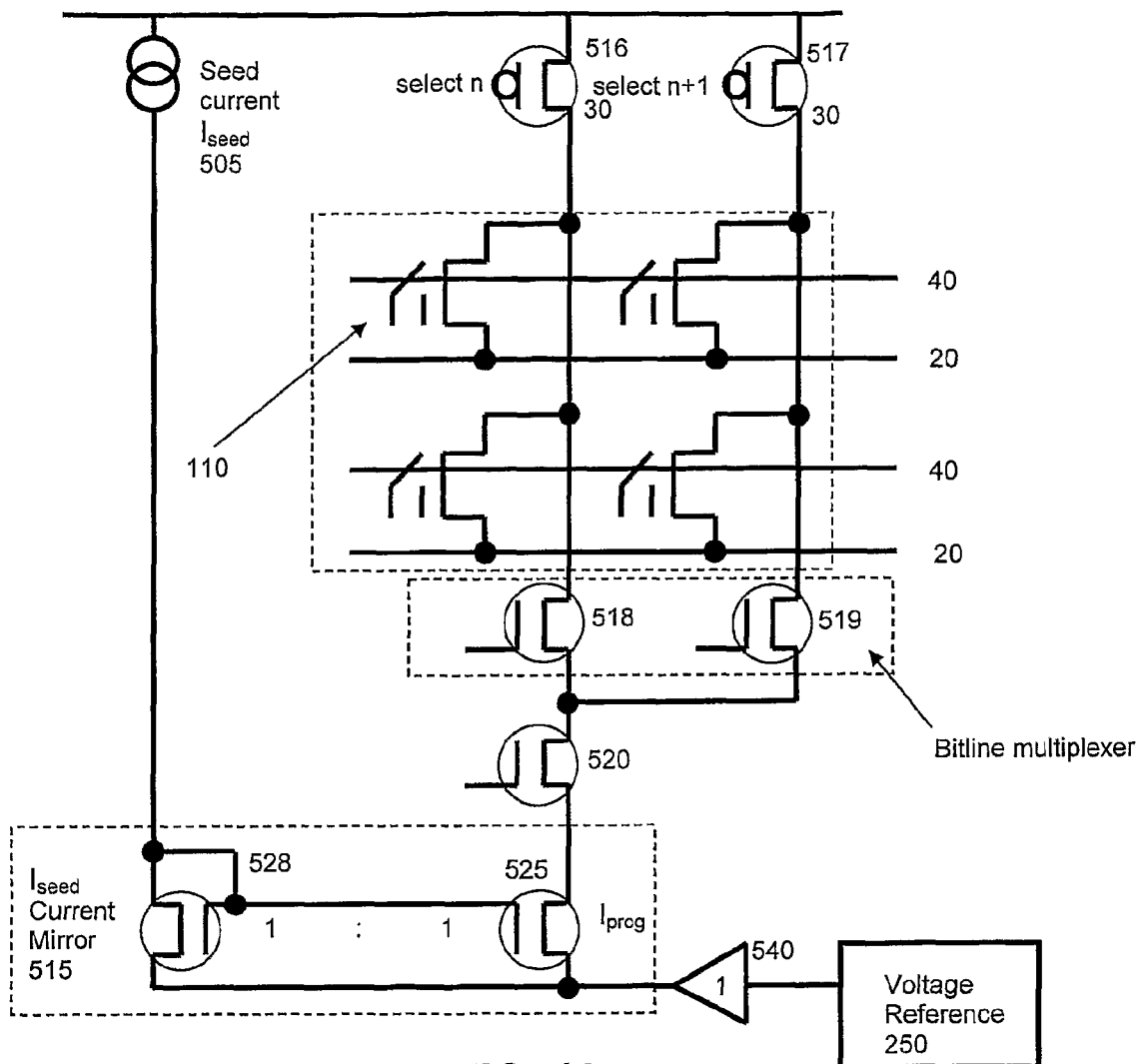
FIG. 12 is a schematic diagram of a bitline current generator of a non-volatile memory device incorporating the programmable voltage reference according to the present invention.

FIG. 12 shows another exemplary use of a programmable voltage reference of the present invention. In this example, the programmable voltage reference 250 is being used in the programming current generation circuit for a non-volatile memory device to control the end of programming voltage, Veop.

In this circuit, each of the bitlines 30 are connected to the program voltage supply via a PMOS select transistor (516 and 517) operating in saturation mode, i.e. effectively operating as a fully on/fully off switch. When a gate input voltage is applied to turn on one of these select transistors, the respective bitline 30 is strongly forced, i.e. fully connected, to the supply. This ensures the row disturb margin is maintained throughout operation.

Meanwhile, the output of a current source 505 is inputted into the single current mirror 515.

The programmable voltage reference 250 is connected to the bottom supply rail of the current mirror 515 via a unity gain amplifier circuit, i.e. buffer, 540. This allows the programmable voltage reference 250 to set the voltage of the bottom rail of the single current mirror 515, and hence set the voltage applied to the bottom of the selected bitline 30, i.e $V_{eop}$. In this way, the end of programming voltage, Veop, may also be set independent of the physical dimensions of the devices used in the circuits.

Figure 13:
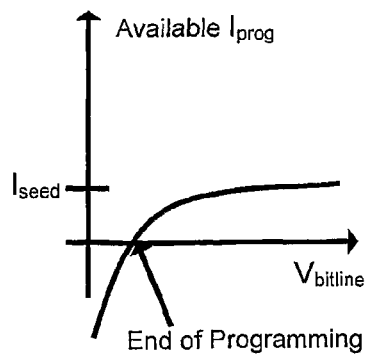
FIG. 13 is a graph showing the relationship between the available programming current, $I_{prog}$, and the bitline voltage, $V_{bitline}$, of the circuit of FIG. 12 according to an embodiment the present invention.

FIG. 13 shows the equivalent relationship between $I_{prog}$ driven through the bitcell and the bitline voltage, in accordance with an embodiment of the present invention. Programming of a bitcell 10 stops when the available $I_{prog}$ current reaches zero, as shown in FIG. 13, and this point is defined by the value of Veop, the value of which is set by the programmable voltage reference 250, as described above. This is also known as a setpoint. This ensures the bitline disturb margin is maintained (see FIG. 7 and the accompanying description).

Figure 14:
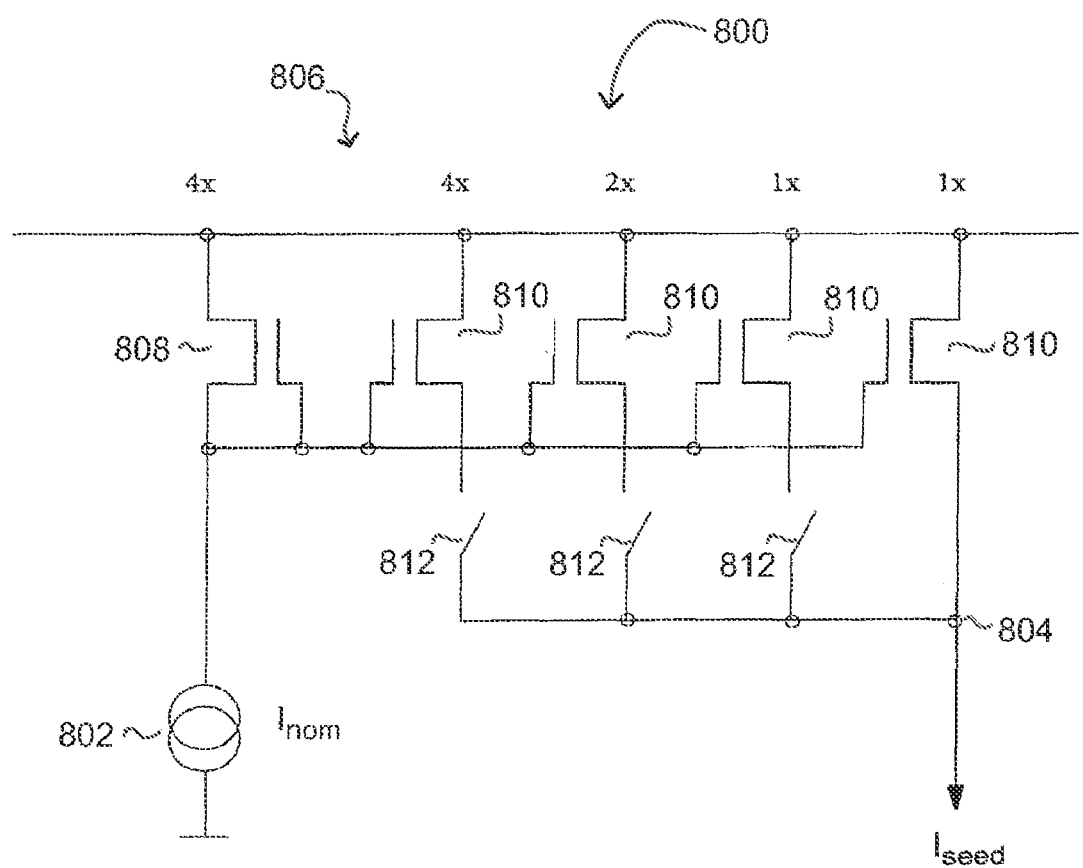
FIG. 14 is a schematic diagram of a programmable current reference in accordance with an embodiment of the present invention.

Referring now to FIG. 14, which shows a programmable current reference 800 in accordance with an embodiment of the present invention which may be used as the current source 505 in the programming current generation circuit for a non-volatile memory device as shown in FIG. 12. The programmable current reference 800 comprises a fixed current source 802 which provides a stable current source. Such fixed current sources are well known in the art and may include, for example, a resistor biased by a bandgap voltage generator. The programmable current reference further comprises a current mirror 806 having an input coupled to receive the stable current signal from the fixed current source 802 and an output 804 for providing an output current signal Iseed. The current mirror 806 comprises an input transistor 808 and a plurality of output transistors 810. Each of the output transistors 810 are selectively coupled to the output 804 via switches 812 depending on the required output current signal Iseed. The state of the switches 812 may be controlled by the processing unit (dedicated or main) which controls the non-volatile memory device. The dimensions of the output transistors 810 are selected so that a multiple of the value of the stable current signal is provided as the output current signal Iseed. With the dimensions shown in FIG. 14, the step size is 0.25 and the output current signal may range from 0.25 to 2 times the stable current signal depending on which output transistors 810 are connected to the output 804.

Memory cells produced by different wafer runs may require different levels of current for optimum performance. A certain level of current is required to program properly the selected memory cells. If the current level is too high, damage (oxide damage) to the memory cell increases and optimum program erase cycling performance is not achieved.

In an embodiment of the present invention, the optimum level for the output current signal Iseed provided by the programmable current reference 800 for a non-volatile memory may be determined during the design and manufacturing process of the device (e.g. through simulation, and/or pre-production testing). This optimum level may then be stored in registers or memory (not shown), for example memory associated with the processing unit (main or dedicated) which controls the non-volatile memory, and then used subsequently to trim the level of the output current signal Iseed provided at the output of the programmable current reference 800. This trimming may be under the control of a software program running on the main or dedicated processing unit. For example, a subroutine may provide, on start-up of the memory device, for the optimum current signal level to be read out of memory and applied to the programmable current reference 800 by the processing unit providing the appropriate controls signals to the switches 812. Furthermore, a look-up table may be generated and stored in memory which provides the optimum levels of the output current signal Iseed for different operating conditions of the non-volatile memory, for example for different operating temperatures. As the operating conditions change, the look-up table can be used by the processing unit to vary the levels of the output current signal Iseed to ensure optimum operation of the non-volatile memory (during operation). This is not possible in the prior art arrangements which use fixed current references.

The foregoing has been explained making use of particular voltage levels as an example only. It will be apparent to the person skilled in the art that other specific types of non-volatile memory will make use of other voltages, and the present invention may equally be applied to these other voltages.

The invention claimed is:

1. A programmable current reference for a non-volatile memory array comprising:
   a fixed current source;
   a programmable current mirror having an input transistor coupled to the fixed current source, an output and a plurality of output transistors coupled to the input transistor and selectively coupled to the output for providing a programmable output current signal, the current level of the output current signal depending on which transistors are selected to be coupled to the output.

2. The programmable current reference according to claim 1 wherein the output transistors are dimensioned such that the current level of the output current signal is a multiple of a current level of the current signal provided by the fixed current source.

3. A non-volatile memory device, including a voltage reference generator, wherein the voltage reference generator comprises a programmable voltage reference for generating a voltage signal having a programmable voltage level, wherein the programmable voltage reference comprises a resistor network Digital-to-Analog converter coupled between first and second supply voltages.

4. A non-volatile memory device according to claim 3, wherein the resistor network Digital-to-Analog converter comprises:
   a plurality of resistors connected in series across a power supply and having a plurality of output taps, wherein a node between two of said plurality of resistors is an output tap providing a fractional voltage of said power supply; and
   a first multiplexer for selecting a one of the output taps for providing a voltage signal having a first voltage level at an output.

5. A non-volatile memory device according to claim 4, wherein the plurality of resistors comprises a predetermined number of resistors, the predetermined number being selected such that the first voltage level of the voltage signal at an output of the first multiplexer is selected from a plurality of voltage levels determined by the predetermined number of resistors between a minimum desired voltage level and a maximum desired voltage level.

6. A non-volatile memory device according to claim 4, further comprising a second multiplexer for selecting a further one of the output taps for providing a voltage signal having a second voltage level at an output of the second multiplexer.

7. A non-volatile memory device according to claim 3, wherein the programmable voltage reference is programmable during operation of the memory device.

8. A non-volatile memory device according to claim 5, further comprising a second multiplexer for selecting a further one of the output taps for providing a voltage signal having a second voltage level at an output of the second multiplexer.

9. A non-volatile memory device according to claim 4, wherein the programmable voltage reference is programmable during operation of the memory device.

10. A non-volatile memory device according to claim 5, wherein the programmable voltage reference is programmable during operation of the memory device.

11. A programmable voltage reference for a non-volatile memory array, said non-volatile memory array having a plurality of memory bitcells arranged in an array of rows and columns, wherein each row is connected to a one of a plurality of wordlines, said programmable voltage reference being coupled to a first supply voltage and comprising:
   a first output for connecting to one or more of the plurality of wordlines; and
   a first programmable voltage source adapted to provide a programming voltage signal to a selected wordline connected to the first output, a voltage level of said programming voltage signal being selected to maintain a predetermined voltage margin between the first supply voltage and the programming voltage signal.

12. The programmable voltage reference of claim 11, wherein each column of the memory array is connected to a one of a plurality of bitlines, the programmable voltage reference being further coupled to a second supply voltage and further comprising:
   a second output for connecting to one or more of the plurality of bitlines; and
   a second programmable voltage source adapted to provide an end of programming voltage signal to selected bitlines connected to the second output, a voltage level of the end of programming voltage signal being selected to maintain a predetermined voltage margin between the second supply voltage and the end of programming voltage signal.

13. The programmable voltage reference of claim 11, wherein the programmable voltage source comprises a Digital-to-Analog converter.

14. The programmable voltage reference of claim 11, wherein the first and second programmable voltage sources comprise a Digital-to-Analog converter coupled between the first supply voltage and the second supply voltage.

15. The programmable voltage reference of claim 13, wherein the Digital-to-Analog converter comprises:
   a plurality of resistors arranged into a resistor divider network; and
   a multiplexer, adapted to selectively couple an output tap of said resistor divider network to the output of the programmable voltage reference.

16. The programmable voltage reference of claim 15, wherein the resistor divider network is arranged such that the ratio of the resistance between a first output tap and the first supply voltage against the total resistance of the resistor divider network is the same as the required ratio between the predetermined voltage margin and the first supply voltage.

17. The programmable voltage reference of claim 12, further comprising a buffer connected to the second programmable voltage source, and adapted to buffer the output of the second programmable voltage source.

18. A non-volatile memory device according to claim 6, wherein the programmable voltage reference is programmable during operation of the memory device.

19. The programmable voltage reference of claim 12, wherein the programmable voltage source comprises a Digital-to-Analog converter.

20. The programmable voltage reference of claim 12, wherein the first and second programmable voltage sources comprise a Digital-to-Analog converter coupled between the first supply voltage and the second supply voltage.

* * * * *